(12) United States Patent
Su et al.

(10) Patent No.: US 7,514,184 B2
(45) Date of Patent: *Apr. 7, 2009

(54) RETICLE WITH ANTISTATIC COATING

(75) Inventors: Wei-Yu Su, Taipei (TW); Dong-Hsu Cheng, Tainan (TW); Li-Kong Turn, Taichung (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 640 days.

This patent is subject to a terminal disclaimer.

(21) Appl. No.: 11/092,734

(22) Filed: Mar. 28, 2005

(65) Prior Publication Data

US 2005/0186488 A1    Aug. 25, 2005

Related U.S. Application Data

(63) Continuation-in-part of application No. 10/273,682, filed on Oct. 18, 2002, now Pat. No. 7,029,800.

(51) Int. Cl.
*G03F 1/00* (2006.01)
*G03F 1/14* (2006.01)

(52) U.S. Cl. .......................................................... 430/5
(58) Field of Classification Search ........................ 430/5
See application file for complete search history.

(56) References Cited

U.S. PATENT DOCUMENTS

| | | | | |
|---|---|---|---|---|
| 5,357,116 | A | * 10/1994 | Talbot et al. | 250/492.21 |
| 5,946,184 | A | 8/1999 | Kanno et al. | |
| 6,569,576 | B1 | 5/2003 | Hsueh et al. | |
| 6,594,073 | B2 | * 7/2003 | Wang | 359/350 |
| 7,029,800 | B2 | * 4/2006 | Su et al. | 430/5 |

* cited by examiner

*Primary Examiner*—Mark F Huff
*Assistant Examiner*—Jonathan Jelsma
(74) *Attorney, Agent, or Firm*—Tung & Associates

(57) ABSTRACT

A static resistant reticle comprises a substrate and a patterning layer and is covered by an antistatic conductive film of quaternary amine $(R_4N)^+Cl^-$. A pellicle structure comprising an optically transparent membrane tightly stretched on a frame is also coated by an antistatic electro conductive film of a similar material. The reticle with the pellicle form a shielded structure isolating the reticle from ESD.

20 Claims, 2 Drawing Sheets

RETICLE WITH ANTISTATIC COATING

RELATED APPLICATIONS

This is a continuation-in-part (CIP) application of U.S. patent application Ser. No. 10/273,682, filed Oct. 18, 2002 now U.S. Pat. No. 7,029,800.

BACKGROUND OF THE INVENTION

1. Field of the Invention

The present invention relates to semiconductor industry, more particularly to reticles used in microlithography, and still more particularly to reticles with a thin film coating to isolate the mask from electric static field.

2. Description of the Related Art

A microlithography (or photolithography) process for manufacturing a semiconductor device comprises a photoresist application process, an exposure process, and a development process. During the photolithography process, semiconductor manufacturers often use a photomask to copy an image of an electronic circuit onto a semiconductor wafer. Photomasks come in various sizes and shapes such as 1X and 2X photomasks or 2X, 2.5X, 4X, and 5X reticles. Depending on the reduction factor X, line width and line space geometries for a resulting semiconductor device are from less than 10 microns to less than 2 microns. Other mask line spacings and semiconductor line spacings also can be achieved. When working with such small geometries, it is important that the reticle and other components in the fabrication processes be free of foreign particles. A tiny speck of dust alters the desired pattern to be imaged onto the wafer. Conventionally, a thin transparent membrane, referred to as a pellicle membrane, is applied over the photomask portion of the reticle to keep the photomask portion free of foreign particles. The pellicle membrane typically is positioned at a height above the photomask. Such height is greater than the focal length of the light imaged onto the photomask. Thus, small particles on the pellicle membrane will not block light from reaching the photomask.

Reticles are a type of photomask that can be shot several times onto a single wafer with a photolithographic tool known as a stepper or scanner. Photomasks generally include a fused silica (amorphous quartz) blank having a thin patterned opaque metal layer (e.g., chromium, or chrome) deposited on one surface of the blank. Typically, the layer is formed with chrome less than 100 nm thick and covered with an anti-reflective coating, such as chrome oxide. The purpose of the anti-reflective coating is to suppress ghost images from the light reflected by the opaque material. This patterned metal layer contains the microscopic image of the electronic circuit, which is frequently referred to as the photomask's geometry. The quality of this geometry will substantially dictate the quality of the electronic circuits formed on the semiconductor wafers from the photomask. As design rules have moved toward smaller and denser integrated circuit (IC) devices, the integrity of the photomask geometry has become increasingly important.

Due to specific conditions accompanying semiconductor-manufacturing process, namely low humidity (typically 40%±10% RH), it is especially prone to developing static electrical charges. Accumulated on the chrome, electrostatic charge leads to an uncontrolled electrostatic discharge (ESD), one of the key causes of geometry degradation. ESD is created when a force causes a charge imbalance among a photomask's chrome structures. In the photomask context, effects of ESD include material sputtering and material migration. Specifically, depositing its energy into a very small area of the wafer, ESD irreversibly damages the latter literally vaporizing metal conductor lines. Instances of these effects can result in the non-functioning of IC devices created from the degraded photomask. It is not surprising, therefore, that prior art presents a number of technical solutions addressing the ESD problem.

U.S. Pat. No. 5,989,754 issued to Chen et al. provides for a photomask arrangement to prevent reticle patterns of a photomask from peeling caused by electrostatic discharge damage. The photomask includes: a substrate; a plurality of metal shielding layers formed on the surface of the substrate to provide the reticle patterns, wherein each two of the metal shielding layers are spaced apart by a clear scribe line; and a plurality of chrome lines formed on the clear scribe line to connect the adjacent metal shielding layers, thereby increasing the effective surface area of the reticle patterns. Accordingly, when subjected to an accidental electrostatic discharge, the chrome lines act as paths for spreading the static charge from one of the chrome lines to the other.

In U.S. Pat. No. 6,309,781 issued to Gemmink et al., a photomask comprises a transmissive base plate, a first side of which is provided with a layer of a metallic mask material. In this layer, a mask pattern is formed, which is enclosed in an outer region of mask material. The photomask is encapsulated in a protection layer of transmissive and conductive material, which, on the first side of the base plate, is formed at such a distance from the first side that the protection layer remains free of the mask pattern. The photomask is thus protected against electrostatic discharges, which could damage the mask pattern, and the projection of the mask pattern is not adversely affected.

U.S. Pat. No. 6,359,313 issued to Yang et al. teaches an ESD protection transistor for discharging current from an ESD event present on an input/output pad. The ESD protection transistor is capable of improved discharging of excessive current without damage to the semiconductor device and to the ESD protection transistor itself. The ESD protection transistor includes a first conductive line connecting an input/output pad to the source and drain of the transistor at multiple points preventing the convergence of an excessive current at a certain point and ESD damage to the transistor. The transistor also includes a second conductive line formed on an insulating layer such that it does not overlap with the first conductive line.

SUMMARY OF THE INVENTION

A primary object of the present invention is to provide an antistatic protection for a reticle that would be compatible with existing reticle-pellicle structure and where potential damage from ESD would be eliminated.

According to the present invention, a reticle comprises a quartz substrate and a chrome pattern placed on the substrate and is provided with a film coating of a conductive material that exhibits a shielding effect protecting the reticle by eliminating potential difference on the reticle.

An antistatic material used for coating includes quaternary amine $(R_4N)^+Cl^-$ with M.W. of about 300-500.

The amine used for the coating has chemical formula:

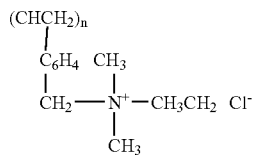

wherein n is an integer larger than 1.

The amine is used in the form of a 0.2~5% solution (w/w) in isopropyl alcohol or deionized water.

The solution is deposited by a spin coating process.

Alternatively, vapor coating may be used for depositing antistatic material on the reticle substrate with subsequent drying.

The reticle with a film deposited on it is subjected to drying in a Marangoni-type dryer in the presence of nitrogen for the duration of 4.5-6 min.

The Marangoni-type drying is followed by a warm air-drying at about 82° C. in the presence of nitrogen for about 8 min.

The film has thickness of about 500-1000 Angstroms (Å).

A pellicle for a reticle comprises an I-line cellulose substrate that is coated by an antistatic coating to prevent ESD on the reticle from occurring.

An antistatic material used for coating includes quaternary amine $(R_4N)^+Cl^-$ with M.W. of about 300-500.

The amine used for the coating has chemical formula:

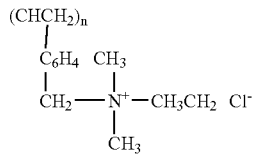

wherein n is an integer larger than 1.

The pellicle film is deposited according to the invention by an immersion of the substrate into a 0.2-1.5% (w/w) water or low-end alcohol solution of the amine.

The pellicle film is deposited by spin coating on the substrate.

The substrate is made of nitrocellulose of $(C_6H_9O_7N)_n$ composition.

The coating deposited on the film preferably has thickness of about 100 Angstroms (Å).

The pellicle is provided by a frame made preferably of aluminum.

The pellicle frame is also made coated with an antistatic dissipative film.

An antistatic material used for coating includes quaternary amine $(R_4N)^+Cl^-$ with M.W. of about 200-500.

The amine used for the coating has chemical formula:

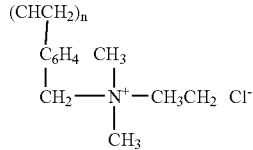

wherein n is an integer larger than 1.

The film can be deposited on the frame by immerse coating of the frame with subsequent natural drying.

The film deposited on the frame preferably has thickness of about 1.5 μm.

BRIEF DESCRIPTION OF DRAWINGS

The above-mentioned and other objects, advantages and features of the present invention will be in more detail illustrated in and will become more apparent to those skilled in the art from the ensuing specification and subjoined claims, when considered in conjunction with the accompanying drawings, in which:

FIG. 2b is a plan view of FIG. 2a;

DETAILED DESCRIPTION OF THE PREFERRED EMBODIMENTS

Figure 1:
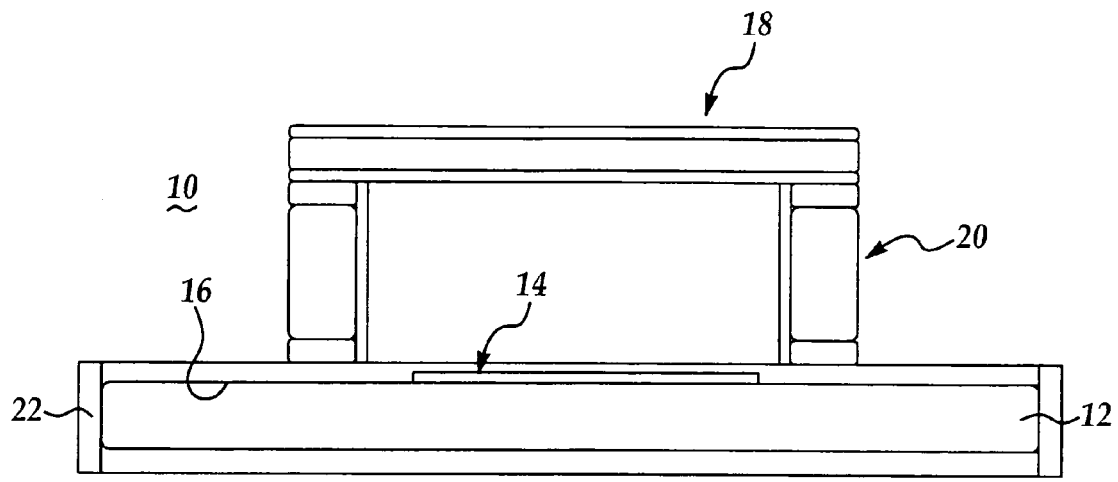
FIG. 1 schematically shows a mask (with a pellicle) according to the present invention.

Referring now to FIG. 1, a photomask (reticle) 10 has a quartz blank 12 with a thin patterned opaque metal layer 14, preferably made of chromium (chrome), deposited on a surface 16 of the blank 12. Typically, the layer 14 is formed with chrome less than 100 nm thick and covered with an antireflective coating, such as chrome oxide (not shown). A pellicle membrane 18 is arranged over the layer 14 of the reticle to keep it free of foreign particles. A frame 20, over which the membrane 18 is tightly stretched, allows positioning the latter at some height above the photomask. Such height (usually, of about 5-10 mm) is greater than the focal length of the light imaged onto the photomask. Thus, a dust particle that found its way on the pellicle is out of focal plane and is invisible to the projection optics. A conventional pellicle frame is made of anodized aluminum.

According to the present invention, a layer 26 of an antistatic film is deposited onto the reticle 10. The layer 26 may be deposited by any convenient method known in the art. Examples of such methods are spin coating process where an agent is dropped on the surface of the substrate and is dispersed on the substrate surface using a centrifugal force generated by rotating the substrate, or preferably, a chemical vapor deposition process. Spin coating and CVD processes are disclosed in numerous sources, of which "Semiconductor Manufacturing Technology" by M. Quirk and J. Serda, Prentice Hall, 2001, pp. 264-282, 343, 348-360, can be mentioned and is hereby incorporated by reference for all purposes.

An antistatic agent used for coating is a cationic polymer of quaternary amine $(R_4N)^+Cl^-$ with a molecular weight of about 300~500, whose chemical formula is:

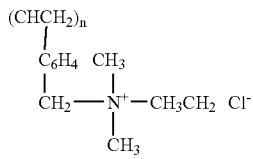

wherein n is an integer larger than 1.

The inventors found that the CVD followed by Marangoni drying is the combination that results in coating of better uniformity. Well known to those skilled in the art, Marangoni drying is an ultra-clean drying process, which relies on surface-tension gradient forces, so-called Marangoni stresses. This method was found to be of particular use in the semiconductor industry wherein obtaining ultra-clean surfaces is of paramount importance. A surface tension gradient driven flow (a Marangoni flow) is used to remove the thin film of water remaining on the surface of the reticle following rinsing. The process passively introduces by natural evaporation and diffusion of minute amounts of alcohol such as isopropyl alcohol (IPA) (or other suitable material) vapor in the immediate vicinity of a continuously refreshed meniscus of deionized water (DIW) or another aqueous-based, non-surfactant rinsing agent. An example of the Marangoni-type drying process is described in J. Marra, "Ultraclean Marangoni Drying," Particles in Gases and Liquids 3: Detection, Characterization, and Control, Edited by K. L. Mittal, Plenum Press, New York, 1993, which is hereby incorporated by reference for all purposes.

For depositing the coating, a 0.2~5% w/w (weight in weight) solution of the agent in IPA is prepared. The reticle is subjected to two cycles of dump rinse with the use of DIW. Then Marangoni drying with the use of nitrogen is conducted during 4.5-6 minutes. Finally, a warm-air drying cycle at 82° C. in the presence of $N_2$ during 8 min is performed. Thickness (in Angstroms(Å)) of a finished coating film layer varies depending on the concentration of the amine agent in IPA. At 0.5%, it is <500; at 1.2% it becomes about 600-800; and at 2% it comes up to about 900-1000

The coating agent and the coating after depositing exhibit good electrical conductivity and isolate or shield the mask (reticle) from electric static field. The film is more than 95% permeable for I-line and deep UV (DUV) light sources; it does not decay and is not damaged by the illumination. Depositing the film eliminates the problem of a potential difference between the quartz substrate and the chrome pattern and thus removes the cause of the ESD. The shielding effect of the coating prevents the reticle from being induced by the ESC. The mask with the coating can shield the mask from ESD as high as 8KV.

Figure 2A:
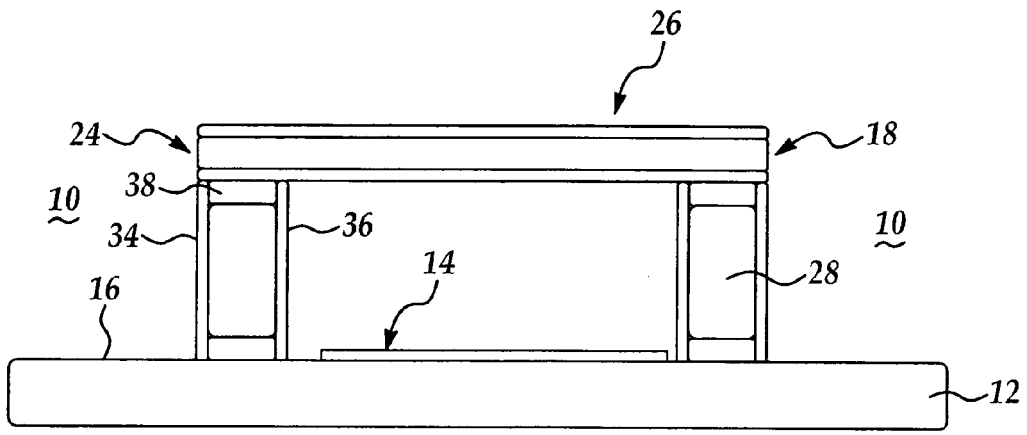
FIG. 2a is a schematical cross section of a front view of the pellicle-reticle structure.
Figure 2B:
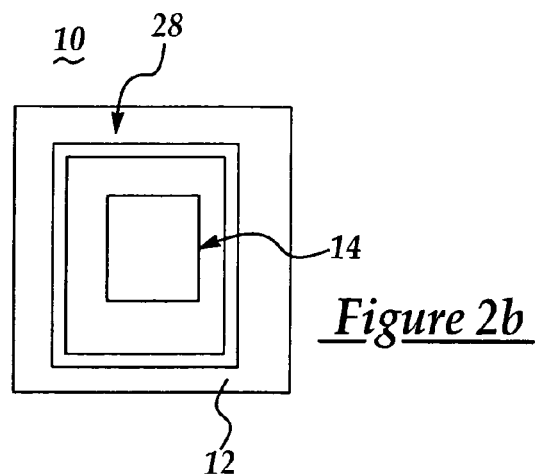

As shown in FIG. 2a, the pellicle membrane 18 comprises a base (substrate) 24 and a layer 26. The base is made of nitro-cellulose $(C_6H_9O_7N)_n$, and the layer 26, in accordance with the principles of the present invention, is an antistatic, dissipative, conductive film. The material for the layer 26 is a quaternary amine $(R_4N)^+Cl^-$, with a molecular weight of about 200~500. A cationic polymer of the material has chemical formula:

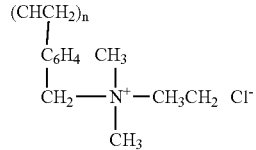

wherein n is an integer larger than 1.

Figure 3A:
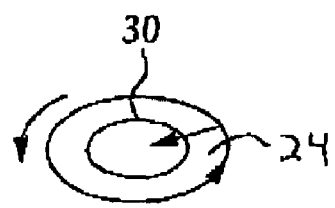
FIG. 3a is an illustration coating deposit in the beginning of the process.
Figure 3B:
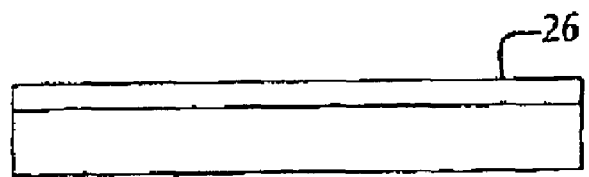
FIG. 3b is a cross-section of a pellicle structure according to the present invention.

The layer 26 can be deposited on the base by immersion of the base into a 0.2-1.5%, preferably 0.5% (w/w) water or low-end alcohol solution of the agent. It is preferable, however, to deposit the agent solution by the spin coating process discussed in the above. Since the cellulose substrate 24 is polarized, the antistatic film exhibits good adhesiveness thereto. Preferable thickness of the finished coating is between 100 and 500. Angstroms (Å). The initial and final phases of depositing are illustrated by FIGS. 3a and 3b. FIG. 3a shows amine/DIW solution 30 placed in the middle of a blank of the substrate 24. A cross-section in FIG. 3b illustrates the pellicle 18 with the film 26 evenly spread over the substrate 24.

Figure 4:
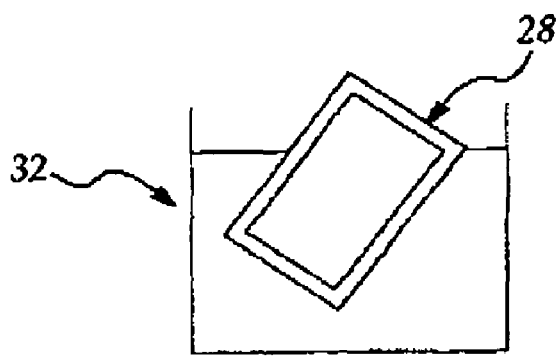
FIG. 4 schematically shows depositing a film coating on a pellicle frame according to the present invention.

The pellicle 18 is supported above the reticle 10 by a frame 28 preferably made of aluminum. It is suggested that an antistatic conductive coating be deposited on the frame. A 1.5% (w/w) solution of the above-discussed amine agent in DIW is prepared, and the frame 28 is coated by immersion into the solution placed in a container 32 (FIG. 4).

It can be seen in FIG. 2a that the frame 28 is coated from both outside (a layer 34) and inside (a layer 36). The coating has thickness of about 1.5µ. The pellicle 18 is attached to the frame 28 by glue designated as 38.

Figure 5:
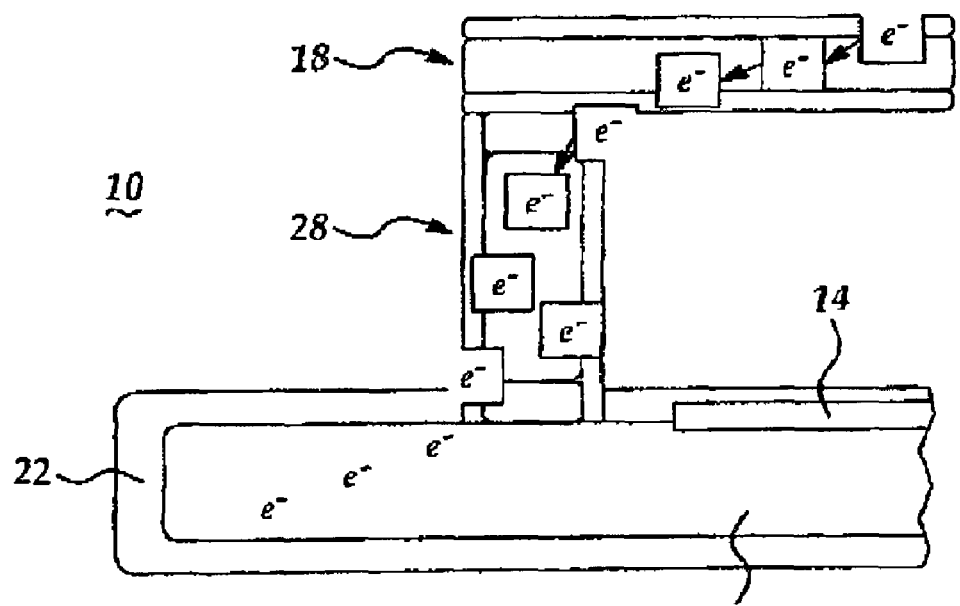
FIG. 5 schematically illustrates neutralizing an electrical charge, which otherwise would accumulate on the mask, according to the present invention.

As schematically shown in FIG. 5, the aluminum frame 28 takes on itself electrical charges from both reticle and pellicle and thus lowers down to a minimum the danger of ESD affecting the reticle/pellicle structure.

While the preferred embodiments of the present invention have been disclosed herein above, it is to be understood that these embodiments are given by example only and not in a limiting sense. Those skilled in the art may make various modifications and additions to the preferred embodiments chosen to illustrate the invention without departing from the spirit and scope of the present contribution to the art. Accordingly, it is to be realized that the patent protection sought and to be afforded hereby shall be deemed to extend to the subject matter claimed and all equivalence thereof fairly within the scope of the invention.

What is claimed is:

1. A method for forming a static resistant reticle for use in integrated circuit lithographic process comprising:
   providing a quartz substrate,
   forming a patterning layer placed on the substrate, and
   forming a film coating of an antistatic conductive material covering the substrate and the patterning layer, wherein the antistatic conductive material comprises a quaternary amine, said quaternary amine comprises $(R_4N)^+Cl^-$ with M.W. of about 200 to about 500 where R comprises a hydrocarbon,
   whereby a shielding effect protecting the reticle by eliminating potential difference on the reticle is attained.

2. The method in claim 1, wherein the patterning layer is made of chrome.

3. The method in claim 1, wherein the quaternary amine has chemical formula:

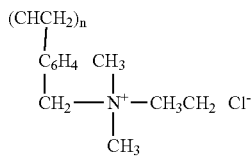

wherein n is an integer larger than 1.

4. The method in claim 1, wherein the quaternary amine comprises a 0.2 to about 5% solution (w/w) in isopropyl alcohol or deionized water.

5. The method in claim 4, wherein the solution is deposited on the reticle by a spin coating process.

6. The method in claim 4, wherein vapor coating is used for depositing antistatic material on the reticle substrate.

7. The method in claim 6, wherein the reticle with the film deposited thereon is subjected to drying in a Marangoni-type dryer in the presence of nitrogen for the duration of 4.5 to about 6 min.

8. The method in claim 7, wherein the Marangoni-type drying is followed by a warm air-drying at about 82° C. in the presence of nitrogen for about 8 min.

9. The method in claim 1, wherein the film coating has thickness of about 100 to about 1000 Å.

10. A method of forming a pellicle used for preventing dust particles from lying on a reticle and for defocusing the dust particles lying on the pellicle, comprising:
providing a pellicle membrane; and
providing a pellicle mounting system including a frame, on which the pellicle membrane is attached and with which the pellicle establishes contact with the reticle, the pellicle being coated by an antistatic electro-conductive coating to prevent ESD on the reticle from occurring, wherein the antistatic electro-conductive coating comprises a quaternary amine, said quaternary amine comprises $(R_4N)^+Cl^-$ with M.W. of about 200 to about 500 where R comprises a hydrocarbon.

11. The method in claim 10, wherein the pellicle membrane comprises nitro-cellulose.

12. The method in claim 10, wherein the quaternary amine has the chemical formula:

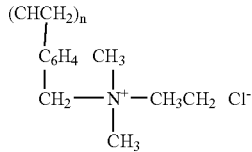

wherein n is an integer larger than 1.

13. The method in claim 10, wherein the coating is deposited by an immersion of the membrane into a 0.2 to about 1.5% (w/w) water or low-end alcohol solution of the amine.

14. The method in claim 10, wherein the coating is deposited by spin coating on the membrane.

15. The method in claim 10, wherein the coating deposited on the film has thickness of about 100 to about 1000 Å.

16. The method in claim 10, wherein the frame comprises anodized aluminum.

17. The method in claim 16, wherein the coating is deposited on the frame by immerse coating of the frame with subsequent natural drying.

18. The method in claim 17, wherein the coating deposited on the frame has thickness of about 1.5 μm.

19. A method of forming a static resistant reticle-pellicle structure for use in integrated circuit lithographic process comprising:
providing a reticle with a quartz substrate and a patterning layer placed on the substrate,
providing a pellicle with a pellicle membrane, and a pellicle mounting system including a frame, on which the pellicle membrane is attached and with which the pellicle establishes contact with the reticle, wherein an antistatic electro-conductive coating is deposited on the reticle and pellicle to thereby shield the structure and prevent ESD on the reticle from occurring, wherein the antistatic electro-conductive coating comprises a quaternary amine, said quaternary amine comprises $(R_4N)^+Cl^-$ with M.W. of about 200 to about 500 where R comprises a hydrocarbon.

20. The method in claim 19, wherein the quaternary amine has the chemical formula:

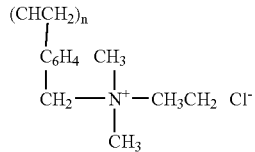

wherein n is an integer larger than 1.

* * * * *